US012400824B2

United States Patent
Biloiu et al.

(10) Patent No.: US 12,400,824 B2
(45) Date of Patent: Aug. 26, 2025

(54) ION EXTRACTION OPTICS HAVING NOVEL BLOCKER CONFIGURATION

(71) Applicant: Applied Materials, Inc., Santa Clara, CA (US)

(72) Inventors: Costel Biloiu, Rockport, MA (US); Adam Calkins, Newmarket, NH (US); Tyler Rockwell, Wakefield, MA (US); Kevin M. Daniels, Lynnfield, MA (US); Christopher Campbell, Newburyport, MA (US)

(73) Assignee: Applied Materials, Inc., Santa Clara, CA (US)

( * ) Notice: Subject to any disclaimer, the term of this patent is extended or adjusted under 35 U.S.C. 154(b) by 457 days.

(21) Appl. No.: 18/080,555

(22) Filed: Dec. 13, 2022

(65) Prior Publication Data

US 2024/0194438 A1 Jun. 13, 2024

(51) Int. Cl.
*H01J 37/09* (2006.01)
*H01J 37/08* (2006.01)

(52) U.S. Cl.
CPC ............. *H01J 37/09* (2013.01); *H01J 37/08* (2013.01); *H01J 2237/002* (2013.01); *H01J 2237/0453* (2013.01); *H01J 2237/20235* (2013.01)

(58) Field of Classification Search
CPC ...... H01J 37/09; H01J 37/08; H01J 2237/002; H01J 2237/0453; H01J 2237/20235;
(Continued)

(56) References Cited

U.S. PATENT DOCUMENTS 7,695,590 B2 * 4/2010 Hanawa ................ C23C 16/045
156/345.43
9,017,526 B2 * 4/2015 Singh ................ H01J 37/32458
204/276
(Continued)

FOREIGN PATENT DOCUMENTS

JP 2013045747 A 3/2013
TW 202107503 A 2/2021
(Continued)

OTHER PUBLICATIONS

International Search Report and Written Opinion of the International Search Authority for International Application No. PCT/US2023/082708, dated Apr. 11, 2024, 21 pages.

*Primary Examiner* — Rudy Zervigon
(74) *Attorney, Agent, or Firm* — KDW Firm, PLLC

(57) ABSTRACT

A processing system may include a plasma chamber and an extraction optics, disposed along a side of the plasma chamber. The extraction optics may include an extraction plate, having an outer side and an inner side, where the extraction plate defines at least one extraction aperture. The extraction optics may include a beam blocker, overlapping the at least one extraction aperture, and disposed towards the inner side of the extraction plate. The beam blocker may have a cross-section that defines a boomerang shape, and may comprise a first metallic material, where the extraction plate comprises a second metallic material. The processing system may further include a substrate platen, disposed outside of the plasma chamber, and movable along a scan direction with respect to the extraction aperture.

20 Claims, 7 Drawing Sheets

(58) Field of Classification Search
CPC ........... H01J 2237/061; H01J 2237/083; H01J 2237/3151; H01J 37/32422
USPC ...................... 118/723 FI; 156/345.39, 345.4
See application file for complete search history.

(56) References Cited

U.S. PATENT DOCUMENTS

| | | | |
|---|---|---|---|
| 9,257,295 B2* | 2/2016 | Singh | H01L 21/67213 |
| 9,293,301 B2 | 3/2016 | Biloiu et al. | |
| 10,141,161 B2* | 11/2018 | Gilchrist | H01J 37/32422 |
| 10,468,226 B1* | 11/2019 | Biloiu | H01J 37/08 |
| 11,127,556 B2* | 9/2021 | Biloiu | H01J 37/08 |
| 11,270,864 B2* | 3/2022 | Biloiu | H01J 37/32422 |
| 2011/0240878 A1* | 10/2011 | Benveniste | H01J 37/3171 |
| | | | 250/424 |
| 2015/0011093 A1* | 1/2015 | Singh | H01L 21/67213 |
| | | | 438/712 |
| 2015/0179465 A1* | 6/2015 | Singh | H01L 21/3065 |
| | | | 438/712 |
| 2016/0013030 A1* | 1/2016 | Venugopal | H01J 37/32623 |
| | | | 156/345.1 |
| 2016/0358744 A1 | 12/2016 | Medoff | |
| 2019/0237292 A1* | 8/2019 | Park | H01J 37/32357 |
| 2020/0098540 A1* | 3/2020 | Biloiu | H01J 37/045 |
| 2021/0035779 A1* | 2/2021 | Biloiu | H01J 37/3053 |
| 2021/0305001 A1* | 9/2021 | Biloiu | H01J 37/3171 |
| 2021/0305011 A1 | 9/2021 | Sinclair | |
| 2023/0124509 A1* | 4/2023 | Biloiu | H01J 37/32357 |
| | | | 250/423 R |
| 2023/0197422 A1* | 6/2023 | Ryan | H01J 37/32807 |
| | | | 156/345.39 |

FOREIGN PATENT DOCUMENTS

| | | |
|---|---|---|
| TW | 202205332 A | 2/2022 |
| WO | 2022015432 A1 | 1/2022 |

* cited by examiner

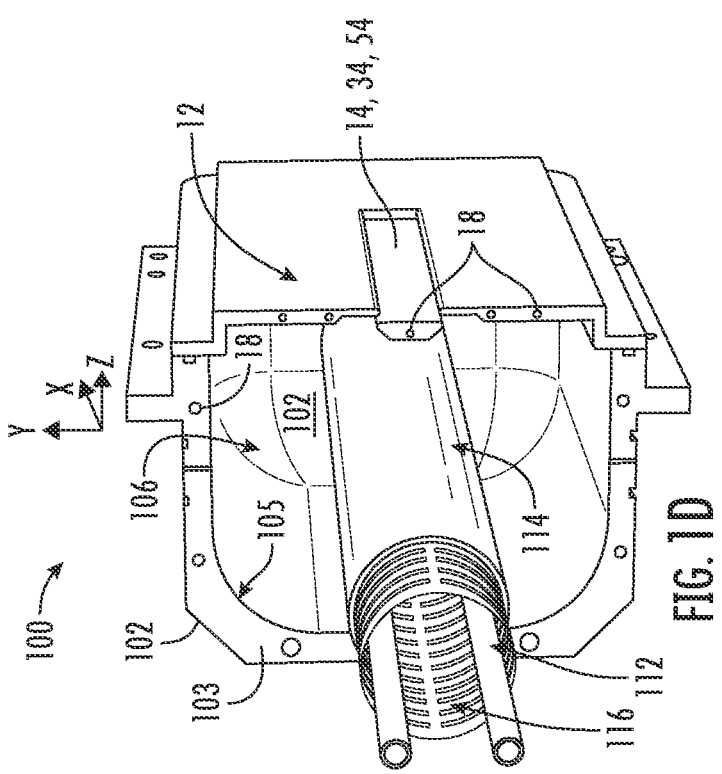
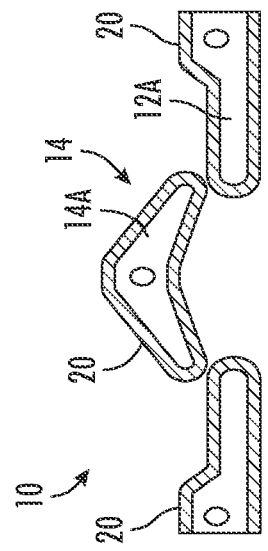
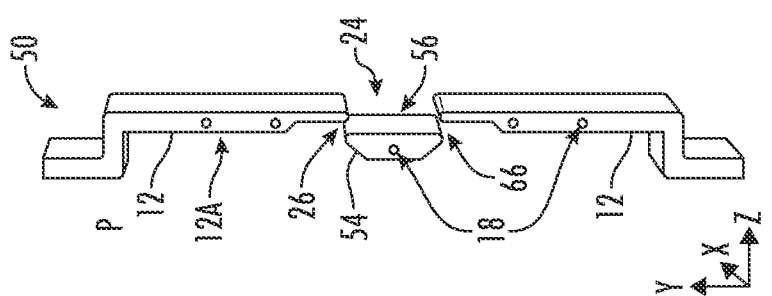
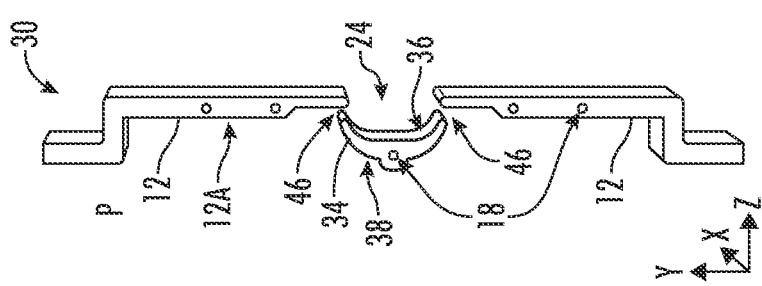
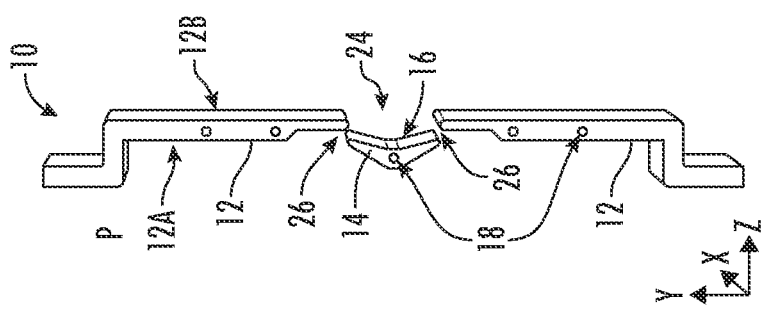

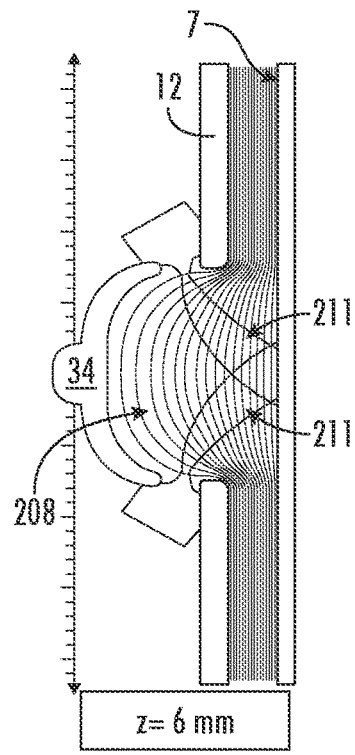
FIG. 3A
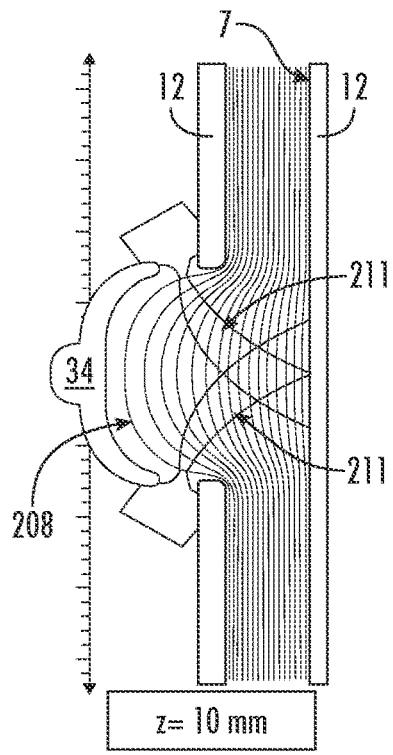
FIG. 3B
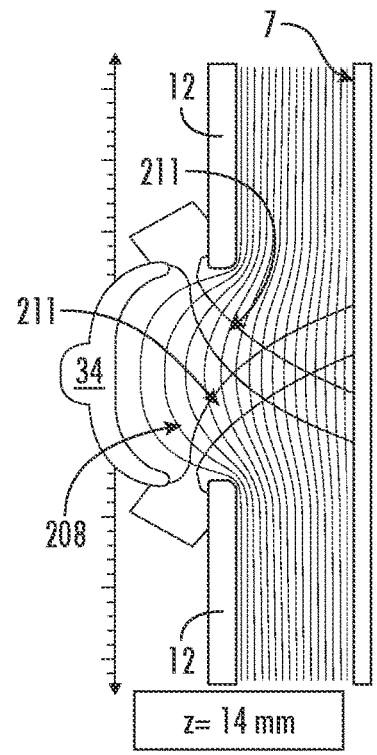
FIG. 3C
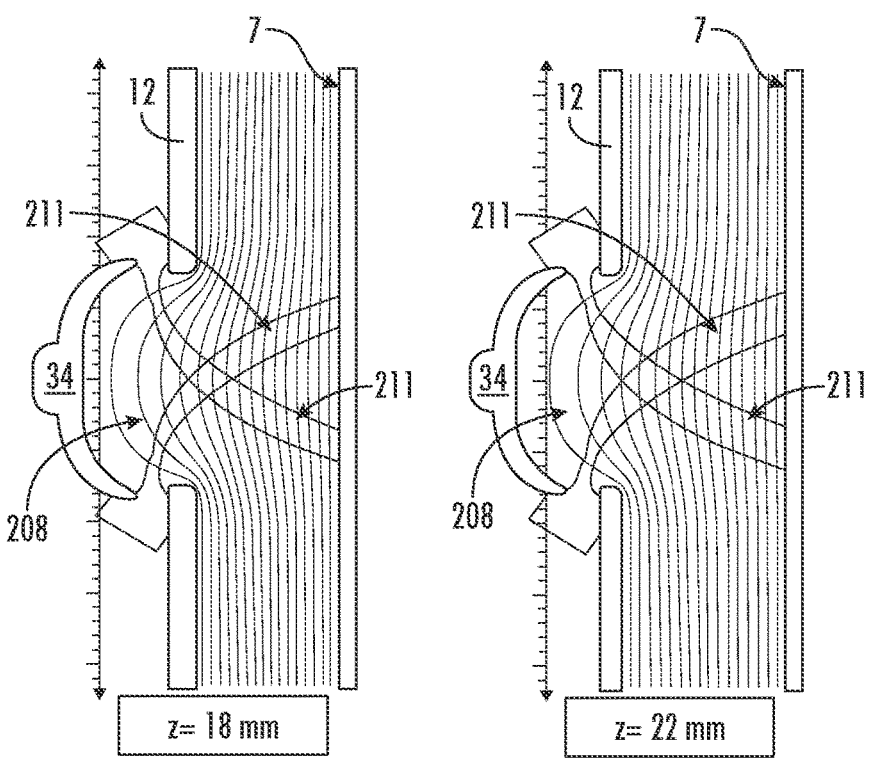
FIG. 3D
FIG. 3E

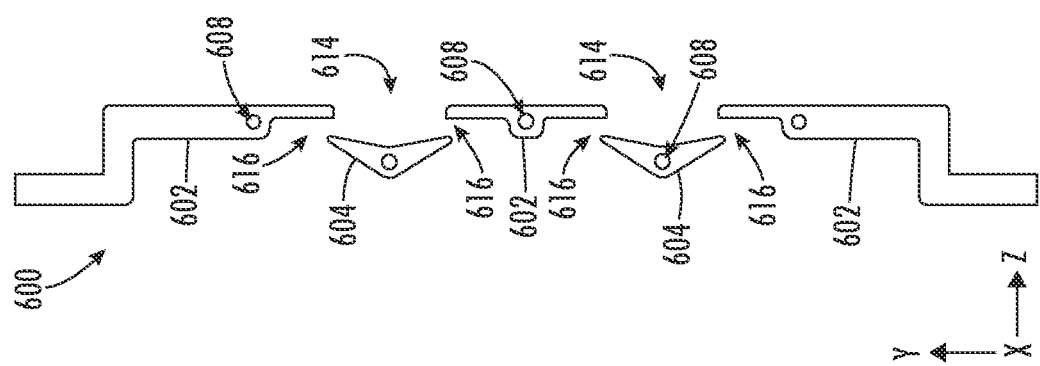
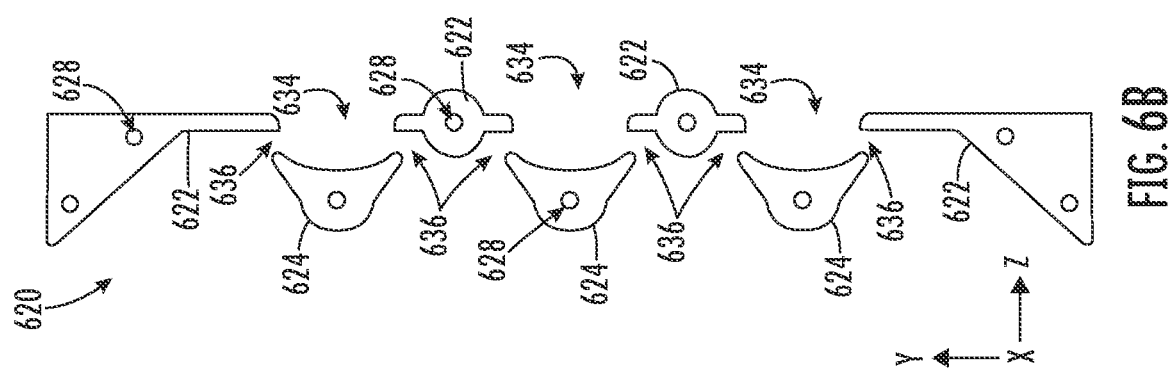
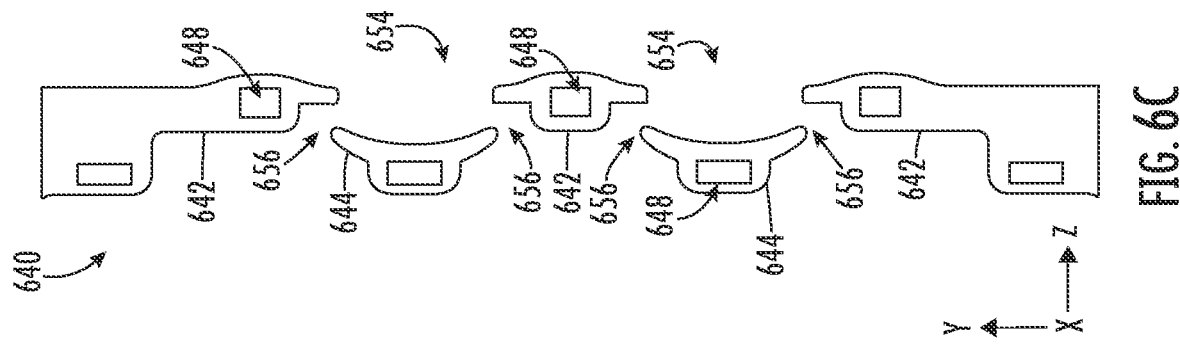

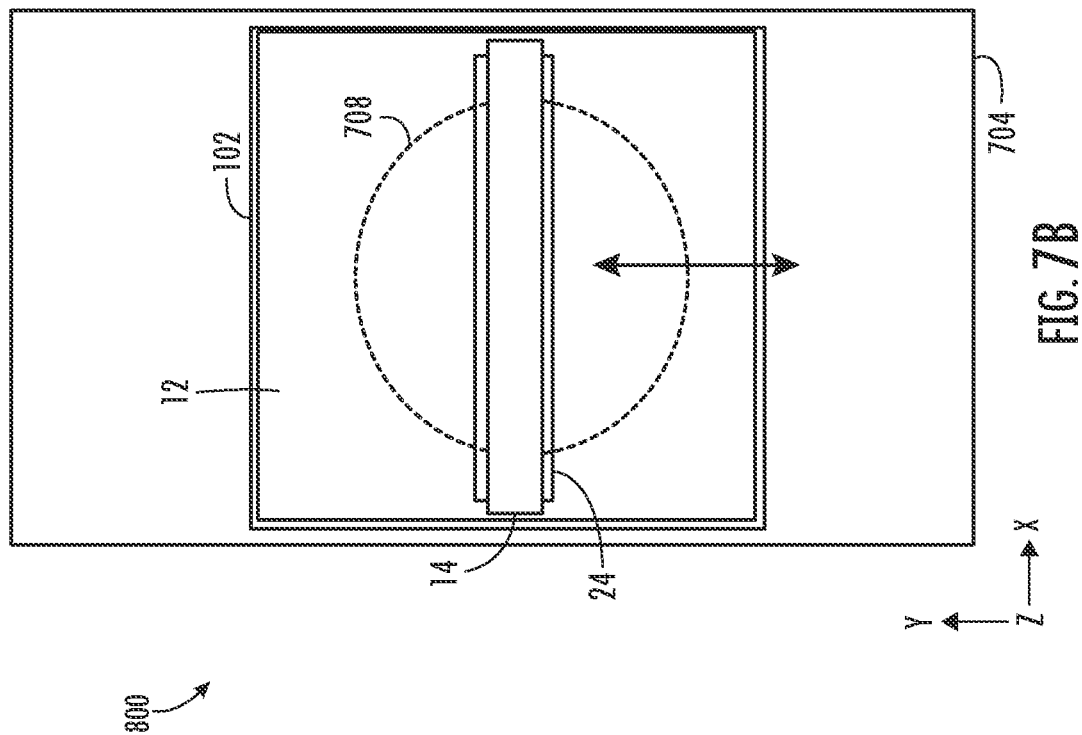
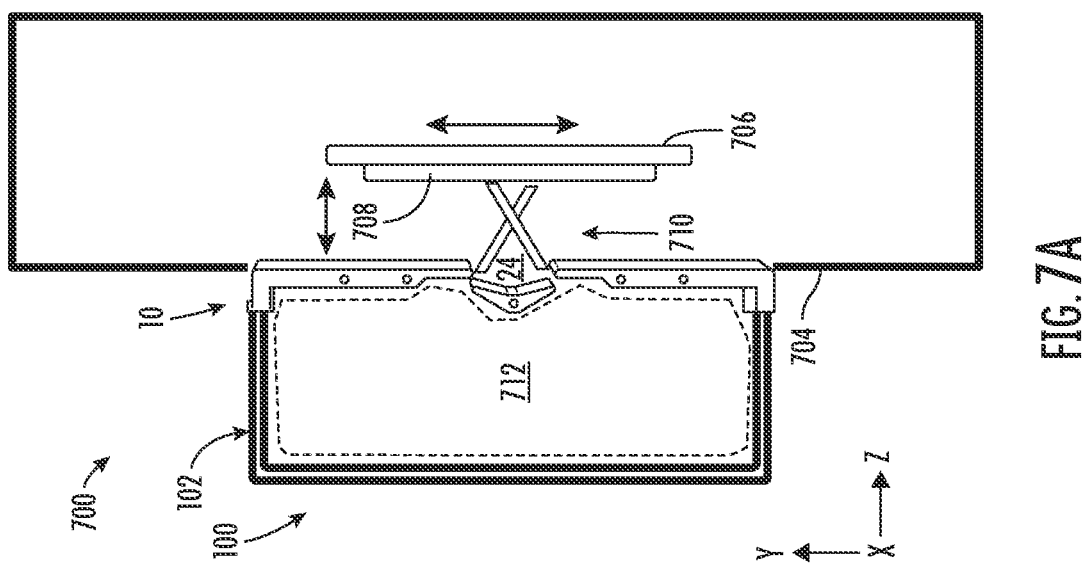

ION EXTRACTION OPTICS HAVING NOVEL BLOCKER CONFIGURATION

FIELD OF THE DISCLOSURE

The disclosure relates generally to plasma processing apparatus, and more particularly to ion assisted processing and plasma based ion sources.

BACKGROUND OF THE DISCLOSURE

In the present day, plasmas are used to process semiconductor substrates to make integrated electronic circuitries. In such applications ions are involved in substrate etching, ion implantation, thin films deposition, and other processes. Some processing apparatus employ a plasma chamber that generates a plasma to act as an ion source for substrate processing. An ion beam may be extracted through an extraction optics and directed to a substrate in an processing chamber located adjacent to plasma chamber. Depending on how the energy is delivered to the working gas, plasma in the ion source may be generated in various ways such as rf excitation, dc, or microwave.

According to recent designs, an ion extraction optics is formed using an extraction plate that includes an extraction aperture that is elongated along a given direction, so that an elongated beam or ribbon beam is extracted from the plasma chamber. Specific extraction optics designs employ ion beam shaping electrode, or a beam blocker, or simply "blocker" positioned over the extraction slit. The blocker has the shape of a ruler, having a rectangular cross-section, or similar cross-section, and may extend longitudinally up to several hundred millimeters. Placement of the beam blocker over the extraction aperture may generate a pair of extraction slits that are formed along opposite edges of the extraction aperture. This configuration is suitable to generate symmetrically angled ribbon beams that define ion trajectories forming a non-zero angle of incidence with respect to the normal to the plane of the extraction plate. Thus, these angled ion beams will define a non-normal incidence angle with respect to a substrate that may be placed in the vicinity of the extraction plate an lie parallel to the extraction plate.

Such ion extraction apparatus may be used for ion-assisted substrate etching, for example, where providing ions at a non-normal incidence angle may be useful for a variety of applications. By scanning a substrate at a constant speed in front of such angled ribbon beams, an entire substrate may be exposed to the same ion treatment (ion energy, mean angle, and ion dose). Known extraction apparatus employ beam blockers and extraction plates made of dielectric material. This material is useful since the dielectric material may resist degradation such as from etching in harsh chemically reactive plasma environments, in contrast to metallic material which might impurify the plasma with metallic compounds. Moreover, for a given extraction optics geometry, and identical operating parameters, the use of dielectric blocker and extraction plate has been found to generate higher average beam angles as compared to extraction optics using metallic beam blockers and extraction plates.

However, such dielectric material may be a relatively poorer thermal conductor and may lead to thermal gradients in the material, to temperature non-uniformities in a plasma chamber, to drift in plasma chamber characteristics during processing of multiple substrates, as well as larger changes in plasma chamber temperature as process conditions change. These changes in plasma chamber temperature may be reflected in changes in process gas temperature, resulting in unwanted variation in substrate etch rates, for example.

With respect to these and other considerations the present disclosure is provided.

BRIEF SUMMARY

In one embodiment, a processing system is provided, including a plasma chamber and an extraction optics, disposed along a side of the plasma chamber. The extraction optics may include an extraction plate, having an outer side and an inner side, where the extraction plate defines at least one extraction aperture. The extraction optics may include a beam blocker, overlapping the at least one extraction aperture, and disposed towards the inner side of the extraction plate. The beam blocker may have a cross-section that defines a boomerang shape, and may comprise a first metallic material, where the extraction plate comprises a second metallic material. The processing system may further include a substrate platen, disposed outside of the plasma chamber, and movable along a scan direction with respect to the extraction aperture.

In another embodiment, an extraction optics for an ion source is provided, including an extraction plate, having an outer side and an inner side, where the extraction plate defines at least one extraction aperture, elongated along a first direction. The extraction optics may include a beam blocker, overlapping the at least one extraction aperture, disposed towards the inner side of the extraction plate and along the first direction, wherein the beam blocker and at least one extraction aperture define a pair of extraction slits that are elongated along the first direction. The beam blocker may have a cross-section that defines a boomerang shape in a plane that lies orthogonal to the first direction, and may comprise a first metallic material, while the extraction plate comprises a second metallic material.

In a further embodiment, a beam blocker for use in an ion source is provided, including, comprising: a beam blocker body that is elongated along a first direction, wherein the beam blocker body has a cross-section that defines a boomerang shape in a plane that lies orthogonal to the first direction, and wherein the beam blocker body comprises a metallic material; and a dielectric film coating, disposed over a surface of the beam blocker, and encapsulating the beam blocker body.

BRIEF DESCRIPTION OF THE DRAWINGS

FIG. 1A shows a tilted view of a extraction optics, according to embodiments of the disclosure.

FIG. 1B shows a tilted view of another extraction optics, according to other embodiments of the disclosure FIG. 1C there is shown a tilted view of a further extraction optics, according to embodiments of the disclosure.

FIG. 1D depicts an ion source according to embodiments of the disclosure;

FIG. 1E illustrates a close-up view of a portion of an extraction optics according to some embodiments of the disclosure;

FIGS. 3A-3E show a series of images depicting the geometry of equipotential lines and ion beams for an extraction optics, arranged according to embodiments of the disclosure, where the Z-gap dimension is varied between the different figures;

FIGS. 6A-6C shows three different configurations of additional extraction optics, according to further embodiments of the disclosure;

FIG. 7A depicts a side view of a processing apparatus arranged according to embodiments of the disclosure; and FIG. 7B depicts a top view of the processing apparatus of FIG. 7A.

Figure 2C:
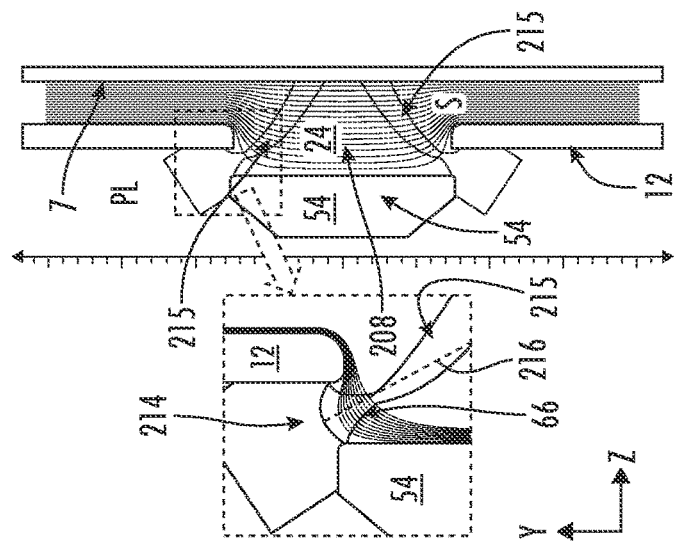
FIG. 2A, FIG. 2B, and FIG. 2C show the results of modelling for the embodiments of FIG. 1A, FIG. 1B, FIG. 1C, respectively.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

An apparatus, system and method in accordance with the present disclosure will now be described more fully hereinafter with reference to the accompanying drawings, where embodiments of the system and method are shown. The system and method may be embodied in many different forms and are not be construed as being limited to the embodiments set forth herein. Instead, these embodiments are provided so this disclosure will be thorough and complete, and will fully convey the scope of the system and method to those skilled in the art.

Terms such as "top," "bottom," "upper," "lower," "vertical," "horizontal," "lateral," and "longitudinal" may be used herein to describe the relative placement and orientation of these components and their constituent parts, with respect to the geometry and orientation of a component of a semiconductor manufacturing device as appearing in the figures. The terminology may include the words specifically mentioned, derivatives thereof, and words of similar import.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

Provided herein are apparatus for improved ion sources that are used to generate angled ion beams.

Turning to the figures, FIG. 1A shows a tilted view of an extraction assembly, denoted as an extraction optics 10, according to embodiments of the disclosure. The extraction optics 10 may include an extraction plate 12, and a beam blocker 14. With reference also to FIG. 1D, the extraction optics 10 may be used in an ion source 100 to generate a pair of ion beams, discussed below. The extraction plate 12 defines an extraction aperture 24, which aperture may be elongated, such as along the X-direction as further illustrated in FIG. 1D. The beam blocker 14 is disposed toward an inner side 12A of the extraction plate 12, overlapping the extraction aperture 24. As such, the beam blocker 14 and extraction aperture 24 define a pair of extraction slits, shown as extraction slits 26 that are elongated along the X-direction.

A feature of the beam blocker 14 is that the beam blocker 14 defines a boomerang shape in cross-section, meaning within the Y-Z plane, where the boomerang shape provides certain advantages for extraction of ion beams, as discussed further below. Briefly, the boomerang shape defines a non-planar surface on the outer side 16 of the beam blocker 14. This shape exhibits two, somewhat planer surfaces, with an obtuse angle between the two surfaces. In some non-limiting embodiments, the outer faces on the outer side 16 are slanted at an inclination of +/−12 degrees with respect to the vertical direction of the figure (Y-axis). The inner faces (facing the plasma side P) may be slanted at an inclination of +/−31 degrees with respect to the vertical to allow plasma diffusion. More generally, a boomerang shape according to other embodiments of the disclosure may include two portions having outer faces inclined from +/−5 degrees to +/−30 degrees with respect to the Y axis, where the Y-axis extends parallel to the main plane of the extraction plate 12. As detailed below, by using a metallic material as a beam blocker, this inclination with respect to the Y-axis will shape electric fields that tend to generate ion beams at higher angles with respect to the Z-axis, useful to achieve high angles of incidence of an ion beam with respect to a perpendicular (Z-axis) to a main substrate plane, where such high angles are called for by a given application.

Turning to FIG. 1B shows a tilted view of an extraction optics 30, according to other embodiments of the disclosure. The extraction optics 30 may include the extraction plate 12, discussed above, and a beam blocker 34. With reference also to FIG. 1D, the extraction optics 30 may be used in the ion source 100 to generate a pair of ion beams, discussed below. The beam blocker 34 is also disposed toward the inner side 12A of the extraction plate 12, overlapping the extraction aperture 24. As such, the beam blocker 34 and extraction aperture 24 define a pair of extraction slits, shown as extraction slits 46 that are elongated along the X-direction.

A feature of the beam blocker 34 is that the beam blocker 34 defines a rounded boomerang shape in cross-section, meaning within the Y-Z plane, where the rounded boomerang shape provides certain advantages for extraction of ion beams, as discussed further below. Briefly, the rounded boomerang shape defines a non-planar, concave surface on the outer side 36 of the beam blocker 34. For example, the outer side 36 may have an arcuate shape defining a small portion of an arc, such as 20 degrees or 30 degrees of arc In one non-limiting example, where the blocker 34 has a height of 35 mm along the Y-axis, the middle part of the outer side may be a flat portion extending for approximately 12 mm, while adjacent parts on either end of the flat portion of the outer side 36 are curved portions, as further shown in FIG. 2B, for example. The inner side 38 of beam blocker is also curved. Like the boomerang shape of FIG. 1A, by using a metallic material as a beam blocker, this concave surface, where the outer side of the distal ends 34A of the rounded boomerang structure are angled with respect to the Y-axis (see FIG. 2B), will shape electric fields that also generate ion beams at higher angles with respect to the Z-axis. Turning to the figures, FIG. 1C there is shown a tilted view of an extraction optics 50, according to embodiments of the disclosure. The extraction optics 50 may include the extraction plate 12, and a beam blocker 54. With reference also to FIG. 1D, the extraction optics 10 may be used in an ion source 100 to generate a pair of ion beams, discussed below. The beam blocker 54 is disposed toward an inner side 12A of the extraction plate 12, overlapping the extraction aperture 24. As such, the beam blocker 54 and extraction aperture 24 define a pair of extraction slits, shown as extraction slits 66 that are elongated along the X-direction. In this embodiment, as well as the aforementioned embodiments, the beam blocker 54 and extraction plate 12 may be formed of a metallic material. In various embodiments of the disclosure, a beam blocker may be made of a first metallic material while the extraction plate is made of a second metallic material, where the first metallic material may be the same as the second metallic material, while in other embodiments, the first metallic material may be the same as the second metallic material.

A feature of the beam blocker 54 is that the beam blocker 54 defines a planar surface on the outer side 56 in cross-section, meaning within the Y-Z plane. In particular, the beam blocker 54 has a parallelepipedal shape with the inner corners chamfered to not impede plasma diffusion toward the extraction slits 66. In one embodiment, the beam blocker 54 may be provided with a thickness of 5 mm to accommodate the cooling channel 18.

In accordance with embodiments of the disclosure, the beam blocker 14 and extraction plate 12 may be made of a metallic material. In some embodiments, the beam blocker 14 comprises a first metallic material, and the extraction plate 12 comprises a second metallic material. In some cases, the beam blocker 14 and extraction plate 12 may be of the same material, such as aluminum. As depicted in FIG. 1A. the extraction plate 12 and beam blocker 14 may be provided with cooling channels, where a blocker cooling channel in beam blocker 14 and a plate cooling channel in extraction plate 12 are designated as cooling channels 18. In some embodiments the cooling channels 18 may be gun drilled cooling channels, while in other embodiments, the cooling channels 18 may be welded cooling channels (made of welded tubing on the body of the extraction plate 12 and beam blocker 14).

Turning again to FIG. 1D, an ion source 100 is depicted, including a plasma chamber 102. One aspect of the design of ion source 100 is the provision of structures to deliver wall temperature control that may maintain the temperature of various parts of the ion source 100, including the extraction plate 12, as well as a beam blocker, such as beam blocker 14, beam blocker 34, or beam blocker 54. The inner volume 106 of the ion source 102 will contain a rarefied mixture of gaseous species during operation, for generating a plasma when energized by a power source (not shown). The ion source 100 may be powered inductively by rf power at driving frequencies between 400 kHz and 40 MHz In the present embodiment as depicted in FIG. 1D, an internal antenna assembly may be used, where the antenna assembly is located within the plasma chamber 102. In particular, a linear antenna 112 coupled to the rf power source of 13.56 MHz may be used to generate a plasma inside the plasma chamber 102. A dielectric cylinder 114 is placed inside the plasma chamber 102. The dielectric cylinder 114 has a double role: a) to seal the rarefied gas inside the plasma chamber 102 (i.e., to act as a vacuum chamber wall) and ii) to allow transmission of the rf power from the rf antenna (linear antenna 112) to the rarefied gas inside the plasma chamber 102. The linear antenna 112 is located inside the dielectric cylinder 114 and may be formed of a hollow tube to conduct cooling fluid therethrough. In addition, atmospheric pressure gas may be blown through the interior of dielectric cylinder 114 to provide cooling external to the linear antenna 112. The linear antenna may be surrounded by a cylindrical Faraday shield 116, aligned concentrically with dielectric cylinder 114. The Faraday shield 114 has the role to eliminate capacitive coupling and thus to reduce sputtering of the dielectric cylinder 116.

As illustrated, in the chamber wall, in the extraction plate 12, and in the beam blocker there are provided cooling channels 18, which channels run parallel with the surfaces of the walls, meaning parallel to the X-axis. By running a cooling fluid where the temperature is controlled by a chiller, the temperature of the plasma chamber walls (see internal wall 105) and extraction optics (extraction plate 12 and a beam blocker (14, 34, 54)) can be controlled during operation. This increased temperature control may be reflected in less unwanted variation in ion beam characteristics, leading to better reproducibility of substrate etching or other substrate processing from wafer to wafer or over a longer duration. In order to perform an efficient heat transfer, the chamber body 103, the extraction plate 12, and the beam blocker may be fabricated of a material having high thermal conductivity, such as a metal, more specifically aluminum.

In various embodiments of the disclosure, the extraction plate 12 may be integrally connected to a beam blocker, such as beam blocker 14, beam blocker 34, or beam blocker 54. As such, the cooling channel(s) 18 in the beam blocker (14, 34, 54) may be communicatively coupled to the cooling channels 18 in the extraction plate 12, wherein a cooling fluid from a single external source may flow through the beam blocker and extraction plate of a given extraction assembly, such as extraction optics 10, extraction optics 30, or extraction optics 50. In other words, a given cooling channel of the extraction optics 10 may run through a beam blocker and through the extraction plate 12. This configuration, in addition to providing a convenient approach to cooling multiple parts of the extraction optics, also allows an extraction optics to be conveniently removed and replaced as a single component as needed. In other embodiments, a beam blocker, shaped similarly to beam blocker 14, beam blocker 34, or beam blocker 54, may be separately detachable from the extraction plate 12, and need not include a cooling channel. These other embodiments may be suitable for applications where cooling control of the beam blocker in particular is not needed.

In accordance with various embodiments of the disclosure, an internal wall 105 of the plasma chamber 102, the extraction plate 12, and the blocker may be protected against corrosive effects of these chemically reactive species. Note that these components may be made of metallic material according to the present embodiments, and if unprotected, will expose a metallic surface directly to a plasma formed in the plasma chamber 102. For etching plasmas in particular, the molecular and atomic species generated inside the ion source 100 are usually highly reactive. If a metallic surface is not protected from the plasma volatile metal compounds may form inside the ion source 100 and then transported outside the plasma source to the surface of the substrate being processed external to the ion source 100, i.e., in the processing chamber. Some of the volatile metal compounds, which circumstance may degrade or even destroy semiconductor devices being fabricated in a substrate.

As such, according to various embodiments of the disclosure, a dielectric film coating 20 is provided on the surfaces of the internal wall 105, extraction plate 12, and beam blocker, such as beam blocker 14, beam blocker 34, and beam blocker 54. An example of the dielectric film coating 20 is shown in FIG. 1E for extraction optics 10. In this example, an embodiment of the beam blocker 14 is shown, having a beam blocker body 14A, surrounded by the dielectric film coating 20. In other words, the dielectric film coating 20 is disposed all over the surface of the beam blocker 14, in a manner that encapsulates the beam blocker body 14A.

In particular non-limiting embodiments, the thickness of the dielectric film coating 20 may be tens of micrometer, one hundred micrometers, or few hundred micrometers. In one embodiment, the dielectric film coating 20 is formed of a mixture of $Al_2O_3$, $Y_2O_3$ and $ZrO_2$. The mixture of these three refractory materials is very resistant to corrosive effect of highly reactive fluorocarbon, hydrocarbon or chlorinated plasma species. The thickness of the dielectric film coating 20, meaning a thickness of approximately several micrometers to few hundred micrometers, may be sufficient to prevent exposure of the beam blocker body 14A and inner side 12A and the outer side 12B of extraction plate 12 to a plasma, while being sufficiently thin to not affect the distribution of external electric fields. In other words, the beam blocker 14 and extraction plate 12 will behave as metallic bodies when a voltage is applied between the extraction optics 10, 30, 50 and ground (see FIGS. 2A-2C, discussed below).

The dielectric film coating 20 may be deposited by using plasma spray guns, for example. In some embodiments, once deposited, the dielectric film coating 20 may be polished in order to eliminate any imperfections, cracks, and/or pores, which defects, if not eliminated, may become centers for erosion initiation during plasma processing. To facilitate post-deposition polishing, in accordance with embodiments of the disclosure, the extraction plate 12 and the given beam blocker have geometries with open surface topologies to allow deposition and subsequent polishing.

To facilitate effective heat transfer, in various embodiments, the beam blocker and extraction plate have relatively lower caloric capacity; which capacity means a small mass and small volume. In one non-limiting example, in an outer portion, away from the extraction aperture 24 the extraction plate 12 has a plate thickness of 7 mm to allow gun-drilling of 3 mm diameter cooling channels to create the cooling channels 18.

In accordance with various embodiments of the disclosure in the proximity of the extraction aperture 24 the plate thickness is reduced to 3 mm. This reduction in plate thickness near the extraction aperture 24 may aid in the promotion of higher extracted beam current, as detailed in figures to follow. In brief, the extraction slits 26 are provided with a relatively larger field of view of a plasma within the plasma chamber 102, meaning a larger solid angle to allow a greater ion diffusion area from the plasma and therefore greater number of ions extracted from the extraction aperture 24.

As mentioned above with respect to FIGS. 1A-1C the shape of a beam blocker may vary according to different embodiments of the disclosure. As detailed below, this shape will play a role in the characteristics of an ion beam extracted from the ion source 102, and in particular, in the ion angular distribution (IAD) and the range of mean angle values for ion beams that can be generated by a given beam blocker shape.

Figure 2B:
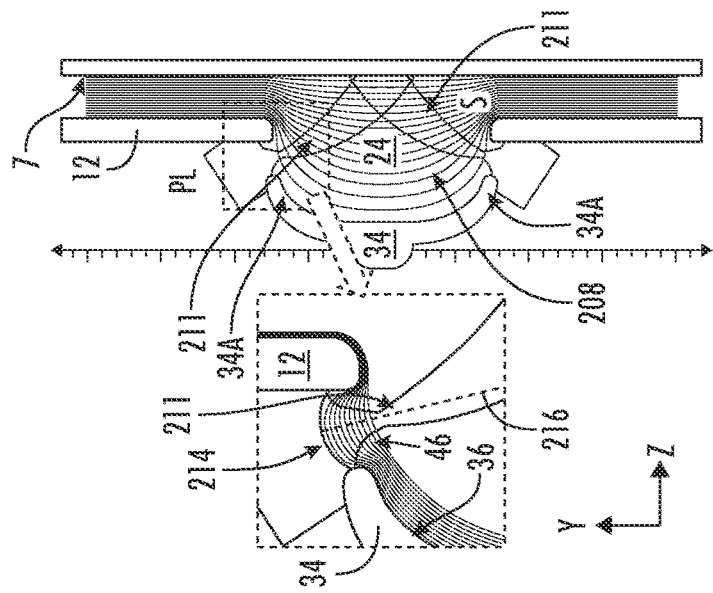
Figure 2A:
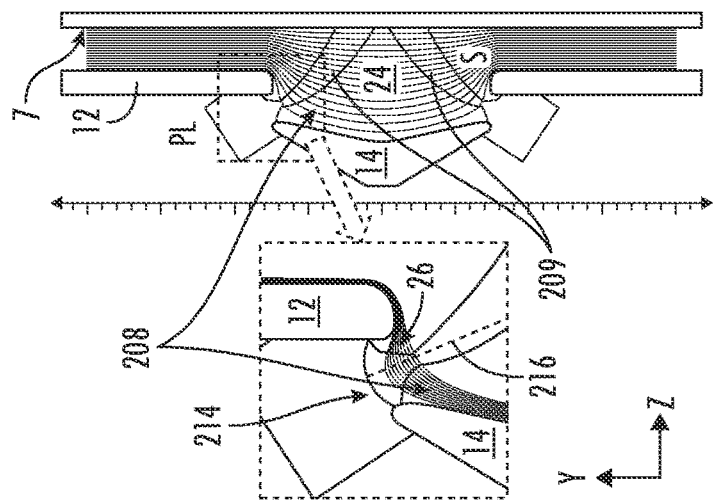

Turning to FIG. 2A, FIG. 2B, FIG. 2C, there are shown the results of OPERA modelling for the embodiments of FIG. 1A, FIG. 1B, FIG. 1C, respectively. In these simulations, a plasma PL is generated to the left of the figures, while an extraction voltage having a magnitude of 1.7 kV is applied between the substrate 7 and extraction optics that includes a beam blocker (14, 34, 54) and extraction plate 12.

To extract positive ions, the ion source and extraction optics are held at ground potential whereas the substrate is biased at negative potential. Equipotential lines distribution are shown (from 0 to −1.7 kV in 100 V steps in regular views, and from 0 to −100V in 10 V steps for expanded views) to illustrate the qualitative shape of electric fields generated. As illustrated therein, the shape and the direction of an ion beam is determined by the shape and orientation of a plasma meniscus that forms the boundary between the plasma and vacuum. Through continuity and energy conservation laws, the ion flux is related to the Bohm flux at the extraction aperture and thereby related to the bulk plasma density. Accounting just for single ionized ions (Z=1), the Bohm current density at the emitting surface is given by $$j_B = 0.6 l e n_0 \sqrt{k_B T_e / m_i}$$

where e stands for elementary charge, $n_0$ for ion bulk density supposed equal to electron density, $k_B$ for Boltzmann constant, $T_e$ for electron temperature and $m_i$ for ion mass. In the model the shape and the location of the plasma meniscus are self consistently solved by balancing the Bohm current density against space-charge limited current density given by Child-Langmuir law $$j_{C-L} = \frac{4\varepsilon_0}{9} \left(\frac{2e}{m_i}\right)^{\frac{1}{2}} \frac{V_e^{\frac{3}{2}}}{z^2}$$

where $\varepsilon_0$ is the dielectric constant of the vacuum, $V_e$ the extraction voltage, and z interelectrode gap.

Note that according to the present embodiments, and in the simulations of FIGS. 2A-2C, the materials of the beam blockers (14, 34, 54) and extraction plate 12 are metallic, therefore good electrical conductors (the dielectric film coating 20 may be ignored due to the minimal thickness). Since metals are opaque to electric field lines in the simulations of FIGS. 2A-2C, the electrostatic field lines 208 cannot penetrate into the plasma as the case for dielectric extraction optics used in known apparatus. On outer surfaces (those facing the wafer, or substrate side S) electrostatic field lines follow the topology of the respective surfaces except the small portions of the extraction slits (26, 46, 66) where the electrostatic field lines protrude more on less into the plasma PL depending on the values of $n_0$, Te, Ve and z in the balance equation discussed above. As depicted by comparison of the field line shape in FIGS. 2A-2C, changing the outer shape of the beam blocker towards the substrate side S changes the distribution of equipotential lines next to the respective beam blocker in the region of the extraction aperture 24 and the respective extraction slits (26, 46, 66), while the equipotential lines adjacent to the extraction plate 12 remain unchanged because the extraction plates 12 are the same in the three different embodiments. Then the meniscus 214 changes shape accordingly. For vertical electrostatic field lines in the extraction aperture 24 area, meaning field lines parallel to the Y-axis, as the case of the embodiment of FIG. 2C, the normal 216 on the meniscus surface in the center of the meniscus 214 has a certain inclination. For the boomerang blocker case depicted in FIG. 2A the field lines are tilted 12 degrees with respect to vertical. This lead to an increased inclination of the normal 216. For a round boomerang depicted in FIG. 2B, because of the rounded outer side 36, the field lines are even more tilted with respect to vertical (Z-axis). This geometry makes the normal 216 to become even more inclined. The inclination of the normal sets the initial direction of the extracted ion beam (209, 211, 215). A more inclined normal translates into higher on-wafer mean angle (with respect to a perpendicular (Z-axis) to the wafer plane (x-y plane)) of the extracted ion beam.

In various embodiments, the ion source 100 or similar ion sources may be used to generate angled ion beams in a compact ion beam processing apparatus, including different configurations where the extraction optics 10, extraction optics 30, or extraction optics 50 may be deployed to generate angled ion beams for substrate processing. FIG. 7A depicts such a processing apparatus 700, where the plasma chamber 102 is disposed adjacent a process chamber 704. In the particular configuration illustrated in FIG. 7A, the extraction optics 10 is provided on a side of the plasma chamber 102, where the extraction optics 10 also borders a process chamber 704. When a plasma 712 is generated in the plasma chamber 102, an ion beam 710 may be extracted from the extraction optics 10. The ion beam 710 may be formed by two ion beamlets which beamlets impinge upon the substrate 708 at a symmetrically non-zero angles with respect to a perpendicular (meaning the Z-axis) to a main plane of the substrate 708 (meaning the X-Y plane in this example). As such, with the aid of scanning a substrate holder 706 along the Y-direction, an entirety of the substrate 708 may be exposed to an angled ribbon ion beam that is elongated to cover the substrate 708 along the x-axis (see FIG. 7B). Moreover, as shown in FIG. 7B, the substrate holder 706 may be movable along the Z-direction so as to adjust the separation (Z-gap) along the Z-axis between substrate 708 and extraction plate 12 and implicitly shaping ion angular distribution (IAD) without affecting the energy of the ions striking the substrate Turning to FIGS. 3A-3E, there is shown a series of images depicting the geometry of equipotential lines (electrostatic field lines 208) and ion beams 211 for the extraction optics 30, described above, where the Z-gap is varied between the different figures. In FIG. 3A the Z-gap is 6 mm; in FIG. 3B the Z-gap is 10 mm; in FIG. 3C the Z-gap is 14 mm; in FIG. 3D, the Z-gap is 18 mm; and in FIG. 3E the Z-gap is 22 mm. While the results in FIG. 3A-3E are for extraction optics 30, the results for extraction optics 10 and extraction optics 50 are qualitatively similar. Note that the plasma density, electron temperature and extraction voltage are the same for all of FIGS. 3A-3E. It can be observed that in spite of identical plasma density, electron temperature, and extraction voltage, the mean angle of the ion beams 211 decreases as the z gap length is increased. In other words, the angle of the trajectory of ion beams 211 becomes closer to the Z-axis direction as Z-gap is increased. This result may be a consequence of the previously discussed balance equation: as z-gap increases the electric field, which field is roughly equal to the extraction voltage divided by the z gap length, decreases. The decrease in electric field results in less penetration in the plasma, thus a less concave meniscus, then less tilting of the normal 216 (see FIG. 2B for illustration of the meniscus 214 and normal 216) to the meniscus 214, and finally a lower mean angle.

Figure 4A:
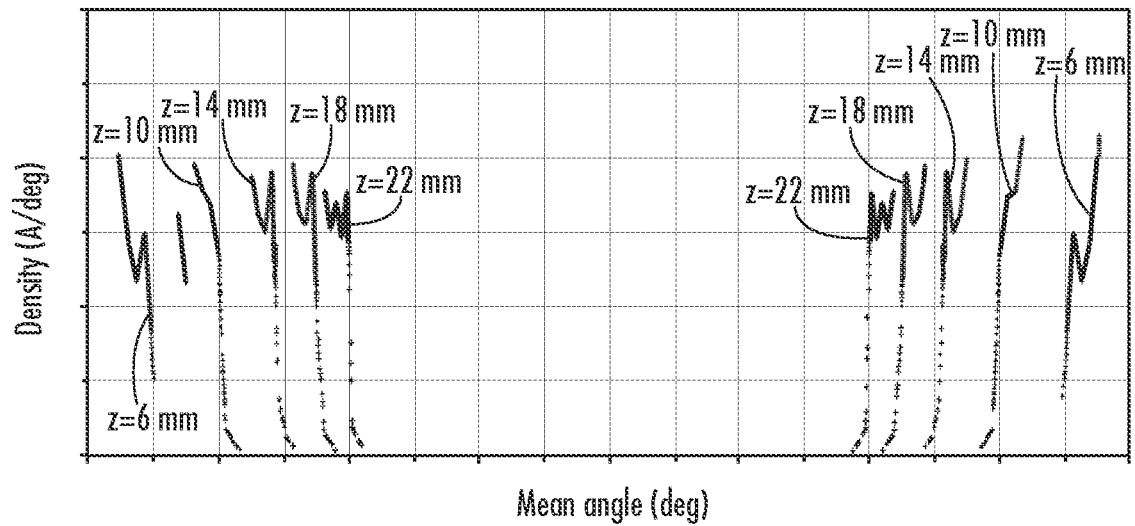
FIG. 4A shows a graph depicting ion angular distributions (beam current density as a function of mean angle with respect to the Z-axis) generated by the extraction optics depicted in FIG. 1B.
Figure 4B:
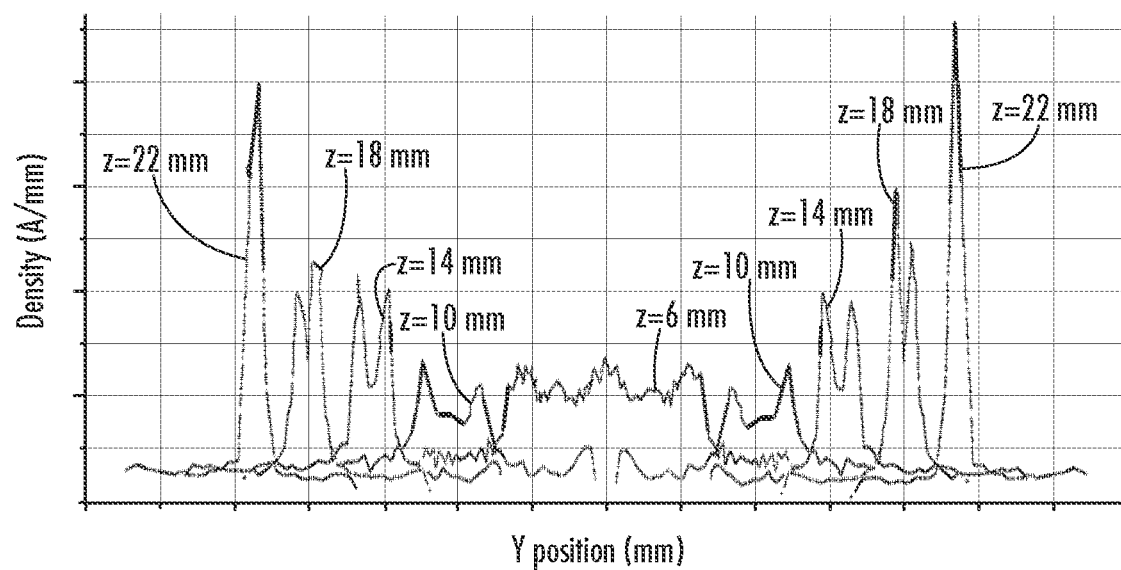
FIG. 4B depicts the current density at a substrate as a function of position along the substrate for the extraction optics of FIG. 1B.

The qualitative observations in FIGS. 3A-3E can be quantified with the help of FIG. 4A. In FIG. 4A there are shown ion angular distributions (IADs) as graphs depicting beam current density as a function of mean angle with respect to the Z-axis. The graph shows two distinct peaks (or abrupt increases) in beam density that are symmetrically disposed about zero degrees (representing the Z-axis). The two distinct peaks represent the ion angular distributions (IAD) of the beam current for the two beamlets that form the ion beams 211, as extracted using extraction optics 30. The mean angle of the IAD is measured with respect to normal on the substrate (the Z-axis direction). As Z-gap is increased from 6 mm to 22 mm, the distribution of current density for the different cases indicates that the mean angle decreases from 37 degrees to 20 degrees. Furthermore, as depicted in FIG. 4B, which figure is a graph depicting current density as a function of position along the Y-axis, the on-wafer separation of the beamlets increases. Thus, FIG. 4B depicts the current density at a substrate as a function of position along the substrate. At 6 mm the two beamlets partially overlap and their width can be estimated to be 2.5 mm. Increasing Z-gap increases separation but also decreases the width of the beam.

Figure 5A:
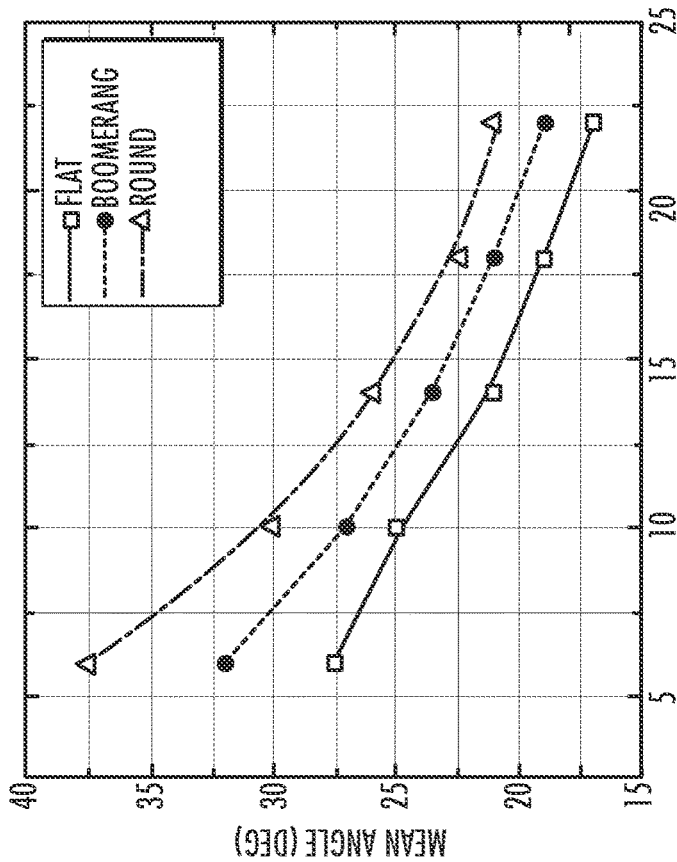
FIG. 5A shows a graph that depicts the mean angle of ion beams generated by an extraction optics of the present embodiments (FIGS. 1A-C), shown as a function of Z-gap.
Figure 5B:
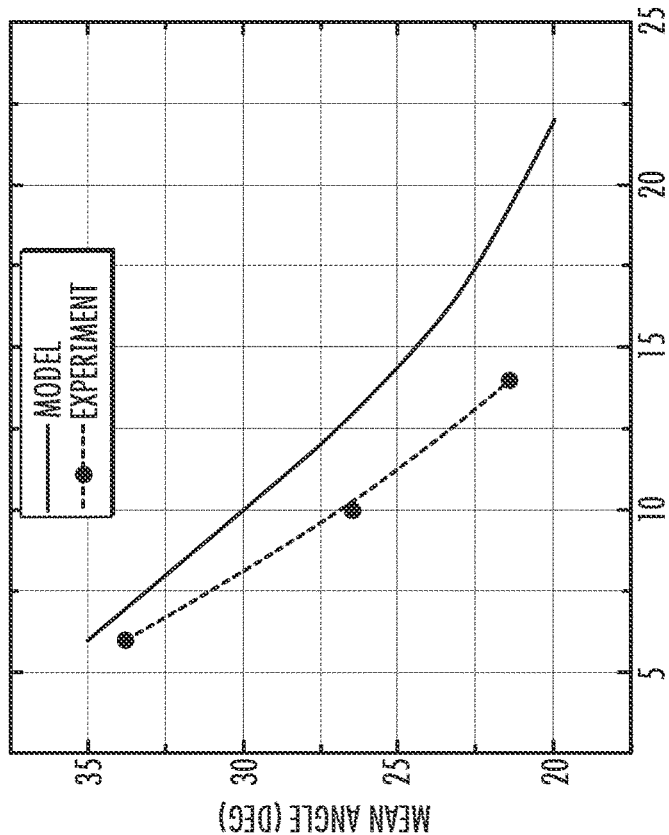
FIG. 5B depicts a comparison between the model and experimentally measured IADs for a variant of a beam blocker arranged according to an embodiment of the disclosure.

Turning to FIG. 5A, there is shown a graph that depicts the mean angle of ion beams generated by an extraction optics of the present embodiments, shown as a function of Z-gap. The three different curves correspond to the geometry of the extraction optics 10, extraction optics 30, and extraction optics 50. As can be seen, mean angle decreases monotonically with the increase in Z gap. For extraction optics 50 the mean angle range is between 17 degrees and 27 degrees. For extraction optics 10 the mean angle shifts to higher angles, between 18 degrees and 32 degrees. For extraction optics 30 the distribution is shifts to even higher angles, from 22 degrees to 37 degrees. FIG. 5B depicts a comparison between the model and experimentally measured IADs for a variant of the beam blocker 34, which comparison shows a very good agreement.

Note that the mean angle can be varied also by varying the extraction voltage of an ion beam. However, varying the extraction voltage also varies the ion energy of the ion beam, which change completely shifts the characteristics of the etching process and, in the case of high energy, may even be detrimental to the substrate to be processed. In the modelling results disclosed herein the voltage used corresponds to the maximum extraction voltage used in a plasma processing for practical applications. For lower extraction voltages the curves in FIG. 5A will shift down. Note also that a suitable beam blocker may be chosen based on the specific application requirements. As one practical guideline, the beam blocker should provide angular distributions having a mean angle that falls in the middle of angular processing space.

Turning to FIGS. 6A-6C, there are shown three different configurations of additional extraction optics, according to further embodiments of the disclosure. These embodiments are provided to address the process throughput. In order to increase the etch rate for a substrate being processed, the overall extracted ion beam current has to be increased. This increase in beam current may be accomplished by increasing the number of extraction slits from 2 to 4 as shown in the extraction optics 600 of FIG. 6A.

In this example, a side cross-sectional view shows an extraction plate 602, having two extraction apertures, shown as extraction apertures 614. A boomerang-shaped beam blocker, shown as beam blocker 604, is disposed adjacent to each extraction aperture, this defining four extraction slits, shown as extraction slits 616. Cooling channels 608 are also provided, as shown, which channels may be fabricated by gun-drilling, a complicated mechanical process used for long channel fabrication, which channels may extend to 400 mm or so. More generally, according to embodiments of the disclosure, an extraction optics may include a plurality of n extraction apertures, and wherein a plurality of n beam blockers are disposed to overlap the plurality on n extraction apertures, respectively, where n represents any suitable integer above 1.

Turning to FIG. 6B and FIG. 6C there are shown alternative configurations for six-slit extraction optics. In FIG. 6B, the extraction optics 620 includes an extraction plate 622, having three extraction apertures, shown as extraction apertures 634. A curved boomerang-shaped beam blocker, shown as beam blocker 624, is disposed adjacent to each extraction aperture and overlapping the aperture, this defining six extraction slits, shown as extraction slits 636. Cooling channels 628 are also provided, as shown, which channels may be fabricated by gun-drilling.

Turning to FIG. 6C an extraction optics 640 includes an extraction plate 642, having three extraction apertures, shown as extraction apertures 654. A curved boomerang-shaped beam blocker, shown as beam blocker 644, is disposed adjacent to each extraction aperture, this defining six extraction slits, shown as extraction slits 656. Cooling channels 648 are also provided, as shown, which channels may be fabricated by welding small U-shaped structures to the bodies of the beam blockers 644 and extraction plate 642 as shown. This approach may be especially useful for fabrication of very wide extraction optics where the beam blocker and extraction plate may be elongated to dimensions of 300 mm, 400 mm, or more, where gun drilling may prove more difficult or time consuming to fabricate such long channels.

In view of the above, the present disclosure provides at least the following advantages: i) the novel extraction apparatus disclosed herein allows control of the plasma chamber temperature and implicitly control of the gas temperature; thus wafer-to-wafer etch rate variation and process drift may be reduced or eliminated; ii) extracted ion beams may have IADs characterized by similar mean angles as the dielectric optics; iii) extracted beam current and implicitly process throughput can be increased by increasing the number of slits without affecting chamber temperature control.

While certain embodiments of the disclosure have been described herein, the disclosure is not limited thereto, as the disclosure is as broad in scope as the art will allow and the specification may be read likewise. Therefore, the above description are not to be construed as limiting. Those skilled in the art will envision such modifications within the scope and spirit of the claims appended hereto.

The invention claimed is:

1. A processing system, comprising: a plasma chamber; an extraction optics, disposed along a side of the plasma chamber, comprising: an extraction plate, the extraction plate having an outer side and an inner side, the extraction plate defining at least one extraction aperture; a beam blocker, overlapping the at least one extraction aperture, and disposed towards the inner side of the extraction plate, wherein the beam blocker has a cross-section that defines a boomerang shape, and wherein the beam blocker comprises a first metallic material, and the extraction plate comprises a second metallic material; and a substrate platen, disposed outside of the plasma chamber, and movable along a scan direction with respect to the at least one extraction aperture, wherein the beam blocker comprises at least one blocker cooling channel.

2. The processing system of claim 1, wherein the extraction plate comprises at least one plate cooling channel.

3. The processing system of claim 2, wherein the at least one blocker cooling channel comprises a gun drilled cooling channel and the at least one plate cooling channel comprises a gun drilled cooling channel.

4. The processing system of claim 2, wherein the at least one blocker cooling channel comprises a welded cooling channel and the at least one plate cooling channel comprises a welded cooling channel.

5. The processing system of claim 1, wherein the boomerang shape is a rounded boomerang shape.

6. The processing system of claim 1, wherein the at least one extraction aperture comprises a plurality of n extraction apertures, and wherein a plurality of n beam blockers are disposed to overlap the plurality on n extraction apertures, respectively.

7. The processing system of claim 1, the beam blocker and the at least one extraction aperture being elongated along a first direction, and defining a pair of extraction slits that are elongated along the first direction.

8. The processing system of claim 1, wherein the first metallic material and the second metallic material are aluminum.

9. An extraction optics for an ion source, comprising: an extraction plate, the extraction plate having an outer side and an inner side, the extraction plate defining at least one extraction aperture, elongated along a first direction; and a beam blocker, overlapping the at least one extraction aperture, disposed towards the inner side of the extraction plate and being elongated along the first direction, the beam blocker and at least one extraction aperture defining a pair of extraction slits that are elongated along the first direction, wherein the beam blocker has a cross-section that defines a boomerang shape in a plane that lies orthogonal to the first direction, wherein the beam blocker comprises a first metallic material, and the extraction plate comprises a second metallic material, and wherein the beam blocker comprises at least one blocker cooling channel.

10. The extraction optics of claim 9, wherein the first metallic material and the second metallic material comprises aluminum.

11. The extraction optics of claim 9, wherein the at least one extraction aperture and the beam blocker are elongated along a first direction, and wherein the extraction plate comprises at least one plate cooling channel.

12. The extraction optics of claim 9, wherein the boomerang shape comprises a rounded boomerang shape.

13. The extraction optics of claim 9, wherein the at least one extraction aperture comprises a plurality of n extraction apertures, and wherein a plurality of n beam blockers are disposed to overlap the plurality on n extraction apertures, respectively.

14. The extraction optics of claim 11, the extraction plate being integrally connected to the beam blocker, wherein the at least one blocker cooling channel is communicatively coupled to the at least one plate cooling channel.

15. A beam blocker for use in an ion source, comprising: a beam blocker body that is elongated along a first direction, wherein the beam blocker body has a cross-section that defines a boomerang shape in a plane that lies orthogonal to the first direction, and wherein the beam blocker body comprises a metallic material; and a dielectric film coating, disposed over a surface of the beam blocker, and encapsulating the beam blocker body, wherein the beam blocker comprises at least one blocker cooling channel.

16. The beam blocker of claim 15, wherein the boomerang shape comprises a rounded boomerang shape.

17. The beam blocker of claim 16, wherein an outer side of the beam blocker comprises a flat portion, and a pair of curved portions, adjacent to the flat portion.

18. The beam blocker of claim 17, wherein an inner side of the beam blocker is curved.

19. The beam blocker of claim 15, wherein the metallic material comprises aluminum.

20. The beam blocker of claim 15, wherein the at least one blocker cooling channel, is elongated along the first direction.

* * * * *